(12) United States Patent
Aburatani et al.

(10) Patent No.: US 10,014,171 B2
(45) Date of Patent: Jul. 3, 2018

(54) METHOD OF MANUFACTURING SEMICONDUCTOR DEVICE

(71) Applicant: Hitachi Kokusai Electric Inc., Tokyo (JP)

(72) Inventors: Yukinori Aburatani, Toyama (JP); Shin Hiyama, Toyama (JP); Tsuyoshi Takeda, Toyama (JP); Naofumi Ohashi, Toyama (JP)

(73) Assignee: Hiatchi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/629,989

(22) Filed: Jun. 22, 2017

(65) Prior Publication Data

US 2017/0372894 A1 Dec. 28, 2017

(30) Foreign Application Priority Data

Jun. 22, 2016 (JP) .................................. 2016-123516

(51) Int. Cl.
*H01L 21/02* (2006.01)
(52) U.S. Cl.
CPC ...... *H01L 21/02271* (2013.01); *H01L 21/022* (2013.01)
(58) Field of Classification Search
CPC .................... H01L 21/022; H01L 21/02271
See application file for complete search history.

(56) References Cited

U.S. PATENT DOCUMENTS

| | | | |
|---|---|---|---|
| 6,090,211 A | 7/2000 | Kamei et al. | |
| 8,772,055 B1 * | 7/2014 | Ranish | H01L 21/67115 118/666 |
| 2001/0015261 A1 * | 8/2001 | Kobayashi | H01J 37/32082 156/345.41 |
| 2003/0170945 A1 * | 9/2003 | Igeta | C23C 16/34 438/200 |

(Continued)

FOREIGN PATENT DOCUMENTS

| | | |
|---|---|---|
| JP | H1014992 A | 6/1998 |
| JP | 2002217183 A | 8/2002 |
| JP | 2011097017 A | 5/2011 |

(Continued)

OTHER PUBLICATIONS

Office Action in corresponding Japanese Patent Application No. 2016-123516, with English translation, dated Oct. 11, 2017.

*Primary Examiner* — Karen Kusumakar
(74) *Attorney, Agent, or Firm* — Edell, Shapiro & Finnan LLC

(57) ABSTRACT

Described herein is a technique capable of improving the productivity of manufacturing of a semiconductor device in a method of processing a film by repeating different processes. A method of manufacturing a semiconductor device may include: (a) loading a substrate into a process vessel; (b) forming a first layer by supplying a first gas into the process vessel by a gas supply unit while maintaining the substrate at a first temperature by a temperature control unit; and (c) forming a second layer different from the first layer by supplying a second gas different from the first gas into the process vessel by the gas supply unit while maintaining the substrate at a second temperature different from the second temperature by the temperature control unit.

3 Claims, 12 Drawing Sheets

(56) References Cited

U.S. PATENT DOCUMENTS

2005/0260835 A1 11/2005 Sha et al.
2011/0263105 A1* 10/2011 Hasebe ............... C23C 16/0272
438/482

FOREIGN PATENT DOCUMENTS

| JP | 2012054343 A | 3/2012 |
| JP | 2013033946 A | 2/2013 |
| JP | 2016-051864 A | 4/2016 |

* cited by examiner

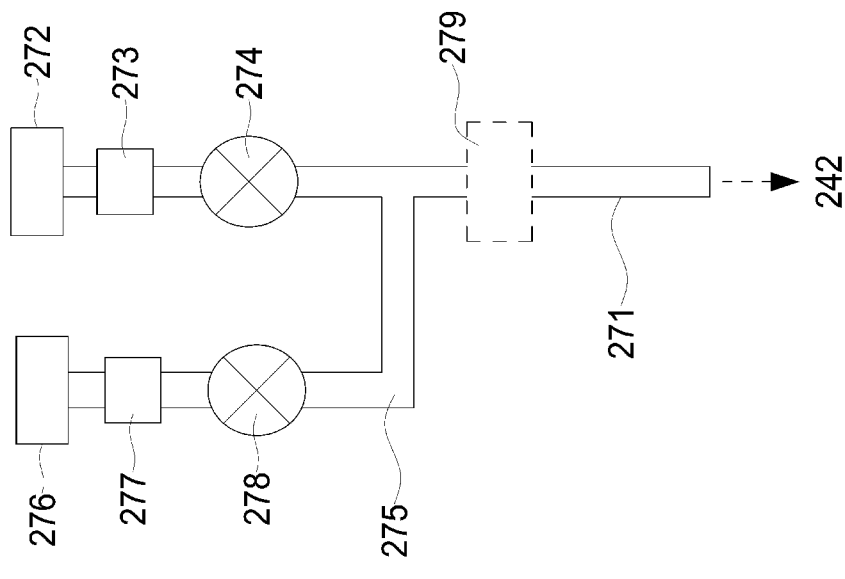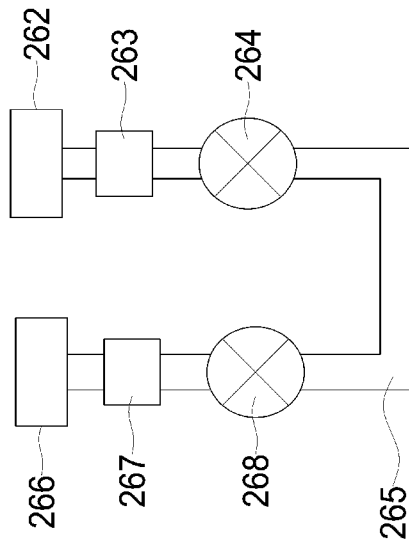

METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2016-123516 filed on Jun. 22, 2016, the entire contents of which are hereby incorporated by reference.

TECHNICAL FIELD

The present disclosure relates to a method of semiconductor device.

BACKGROUND

Generally, the manufacturing of a semiconductor device includes multiple processes such as forming various films on a substrate and processing a substrate (or a film on a substrate). Different dedicated semiconductor manufacturing apparatuses may be used for each process.

Recently, as the device structure becomes more complicated, the number of processes for manufacturing semiconductor devices tends to increase. As described above, when dedicated semiconductor manufacturing apparatus is used for each process, it takes a long time to manufacture a semiconductor device. The dedicated semiconductor manufacturing apparatus includes, for example, a single-type apparatus.

As a process for forming a film or a process for treating a film, a method of repeating different processes may be used. For example, a method of forming a film having a predetermined number of layers by alternately laminating layers having different materials may be used. In this case, each of the layers having different materials is formed by a separate semiconductor manufacturing apparatus. Therefore, in order for a film having a predetermined number of layers to be formed on a substrate, the substrate must be moved between multiple semiconductor manufacturing apparatuses. As a result, it takes a long time to form a semiconductor device.

SUMMARY

Described herein is a technique capable of improving the productivity of manufacturing of a semiconductor device in a method of processing a film by repeating different processes.

According to one aspect of the technique described herein, a method of manufacturing a semiconductor device may include: (a) loading a substrate into a process vessel; (b) forming a first layer by supplying a first gas into the process vessel by a gas supply unit while maintaining the substrate at a first temperature by a temperature control unit; and (c) forming a second layer different from the first layer by supplying a second gas different from the first gas into the process vessel by the gas supply unit while maintaining the substrate at a second temperature different from the second temperature by the temperature control unit.

BRIEF DESCRIPTION OF THE DRAWINGS

FIG. 2 illustrates a configuration of a first source gas supply system according to the embodiment.

FIG. 3 illustrates a configuration of a reactive gas supply system according to the embodiment.

DETAILED DESCRIPTION

First Embodiment

A first embodiment will be described with reference to the drawings.

(1) The Configuration of Substrate Processing Apparatus

Firstly, a configuration of a substrate processing apparatus according to the first embodiment will be described.

Figure 1:
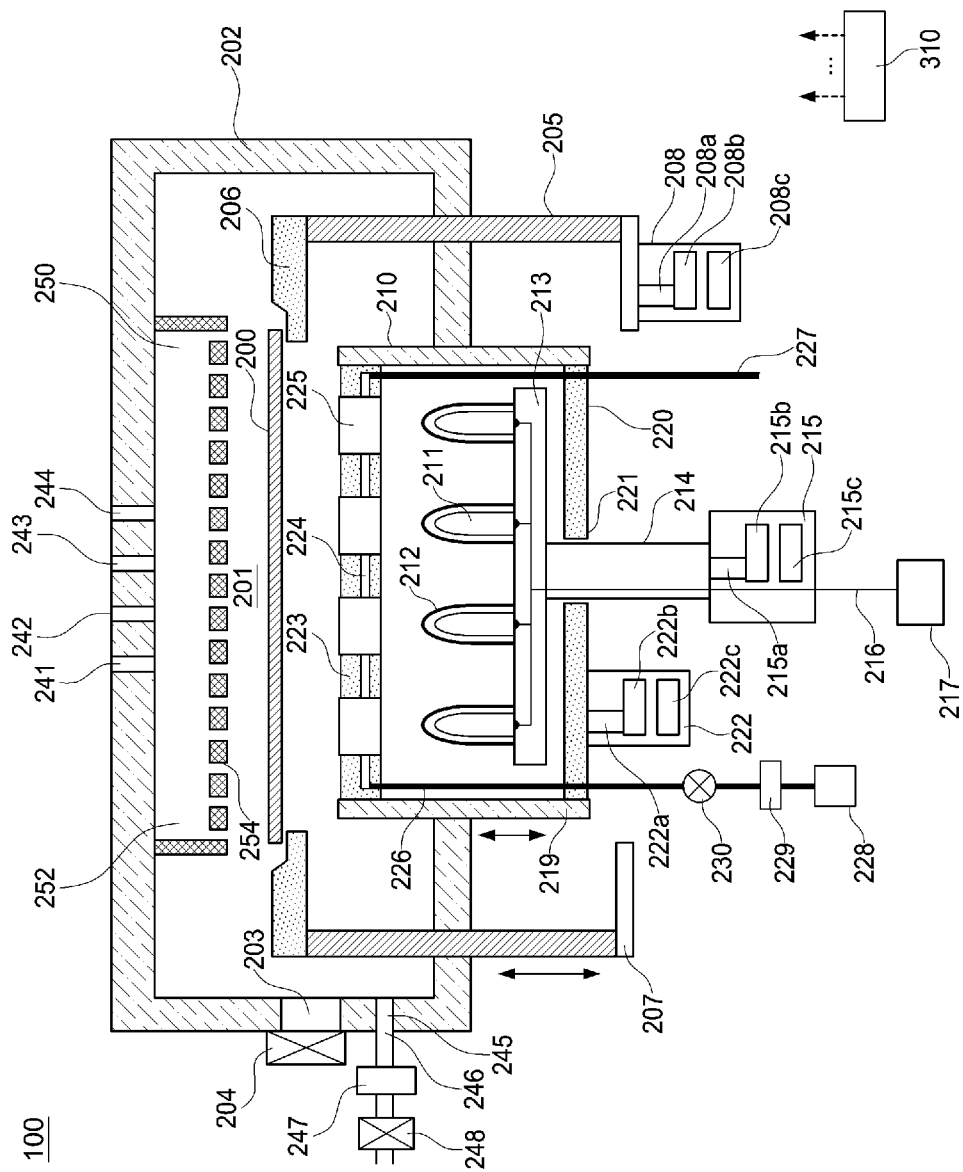
FIG. 1 illustrates a cross-section of a substrate processing apparatus according to an embodiment described herein.

A substrate processing apparatus 100 according to the first embodiment is described hereinafter. The substrate processing apparatus 100 is used to form thin films on a substrate 200. As shown in FIG. 1, substrate processing apparatus 100 includes a single wafer type substrate processing apparatus. The substrate processing apparatus 100 is capable of alternately stacking layers having different components. For example, the substrate processing apparatus 100 is used to form a ZAZ film including ZrOx/AlO/ZrOx laminated structure.

As shown in FIG. 1, the substrate processing apparatus 100 includes a process vessel 202. The process vessel 202 is a flat, sealed vessel having a circular horizontal cross-section. The sidewall and the bottom of the process vessel 202 are made of metal material such as aluminum (Al) and stainless steel (SUS).

A shower head 250 is provided at the upper portion of the inside space of the process vessel. A space surrounded by the process vessel 202 and a lower end of the shower head 250 above the wafer (substrate) 200 is referred to as a process chamber 201.

A substrate loading/unloading port 203 is provided on first side of the process vessel 202. The substrate loading/unloading port 203 is installed adjacent to a gate valve 204. The vacuum transfer chamber (not shown) is provided at a second side of the process vessel 202 different from the first side of the process vessel 202 where the substrate loading/unloading port 203 is provided. The wafer 200 is transferred between the process vessel 202 and the vacuum transfer chamber (not shown) through the substrate loading/unloading port 203.

Substrate Support Unit

A plurality of lift pins 205 are provided at the bottom of the process vessel 202. A plurality of fingers 206 supporting the wafer 200 are mounted on top of the lift pins 205. The outer periphery of the wafer 200 may be supported by the fingers 206.

A lift pin support unit 207 supports lower ends of the plurality of lift pins 205, and provided outside the process vessel 202. A lift pin elevation controller 208 is provided at the lift pin support unit 207, and moves the plurality of lift pins 205 up and down. The lift pin elevation controller 208 is electrically connected to a controller 310 described later.

The lift pin elevation controller 208 includes a support shaft 208a supporting the lift pin support unit 207, an elevation mechanism 208b configured to move the support shaft 208a up and down and an operating unit 208c configured to control the elevation mechanism 208b. The elevation mechanism 208b includes components such as motor to move the support shaft 208a up and down. The operating unit 208c is configured to control the elevation mechanism 208b to move the support shaft 208a according to an instruction from the controller 310. By moving the support shaft 208a up and down, the lift pins 205 move up and down. While an example wherein the operating unit 208c controls the elevation mechanism 208b is described in the first embodiment, the controller 310 may control the elevation mechanism 208b instead of the operating unit 208c.

The controller 310 is configured to instruct the lift pin elevation controller 208 to perform up/down operation such that the wafer 200 is moved up and down. The lift pin elevation controller 208 moves the lift pin support unit 207 up and down according to the instruction from the controller 310. As a result, the wafer 200 is moved up and down. The lift pin elevation controller 208 is configured to move the wafer 200 to a substrate loading/unloading position PW1 and a substrate processing position PW2, which will be described later in detail.

In the first embodiment, the lift pins 205, the fingers 206, the lift pin support unit 207 and the lift pin elevation controller 208 are collectively referred to as substrate support unit.

Lamp Housing

A lamp housing 210 is provided at the bottom of the process vessel 202 without overlapping with the lift pins 205. The lamp housing 210 accommodates a plurality of lamps 211. The lamps 211 heat wafer 200. The lamps 211 are arranged parallel to the back side of the wafer 200 to uniformly heat the wafer 200. A lamp cover 212 is provided for each of the lamps 211. The lamps 211 are supported by a lamp support unit 213. The lamp support unit 213 is supported by a lamp elevation controller 215 via a pillar 214. The lamp elevation controller 215 is electrically connected to the controller 310.

The lamp elevation controller 215 includes a support shaft 215a supporting the pillar 214, an elevation mechanism 215b configured to move the support shaft 215a up and down and an operating unit 215c configured to control an elevation mechanism 215b. The elevation mechanism 215b includes components such as motor to move the support shaft 215a up and down. The operating unit 215c is configured to control the elevation mechanism 215b to move the support shaft 215a up and down according to an instruction from the controller 310. By moving the support shaft 215a up and down, the lamp support unit 213 moves up and down. While an example wherein the operating unit 215c controls the elevation mechanism 215b is described in the first embodiment, the controller 310 may control the elevation mechanism 215b instead of the operating unit 215c.

The controller 310 is configured to instruct the lamp elevation controller 215 to perform up/down operation such that the lamps 211 are moved up and down. The lamp elevation controller 215 moves the lamp support unit 213 up and down according to the instruction from the controller 310. As a result, the lamps 211 are moved up and down. The lamp elevation controller 215 is configured to move the lamps 211 such that front ends of the lamps 211 are at position PL1, position PL2 or position PL3.

The lamps 211 are connected to a lamp controller 217 via wiring 216. The lamp controller 217 is electrically connected to the controller 310. In the first embodiment, the lamp controller 217 is configured to turn on and off the lamps 211 according to an instruction from the controller 310.

The lamp housing 210 includes a sidewall 219. The sidewall 219 may be cylindrical. The lamp housing 210 also includes a bottom portion 220 having a hole 221. The pillar 214 is inserted in the hole 221. A lamp housing elevation controller 222 configured to control the elevation of the lamp housing 210 is provided at the bottom portion 220. The lamp housing elevation controller 222 is electrically connected to the controller 310. The lamp housing elevation controller 222 is configured to move the heat exchanger unit 223 such that the heat exchanger unit 223 is at positions PT1, PT2 and PT3. Since the lamp housing elevation controller 222 is capable of moving the heat exchanger unit 223 up and down, the lamp housing elevation controller 222 may be also referred to as a heat exchanger unit elevation controller.

The lamp housing elevation controller 222 includes a support shaft 222a supporting the bottom portion 220, an elevation mechanism 222b configured to move the support shaft 222a up and down and an operating unit 222c configured to control the elevation mechanism 222b. The elevation mechanism 222b includes components such as motor to move the support shaft 222a up and down. The operating unit 222c is configured to control the elevation mechanism 222b to move the support shaft 222a up and down according to an instruction from the controller 310. By moving the support shaft 222a up and down, the lamp housing 210 moves up and down. While an example wherein the operating unit 222c controls the elevation mechanism 222b is described in the first embodiment, the controller 310 may control the elevation mechanism 222b instead of the operating unit 222c.

The heat exchanger unit 223 is provided at a portion of the lamp housing 210 facing the back side of the wafer 200. The heat exchanger unit 223 is fixed to the sidewall 219. The heat exchanger unit 223 may be cylindrical having a diameter same as the inner diameter of the sidewall 219. The heat exchanger unit 223 moves up and down as the lamp housing 210 is moved up and down. While an example wherein the heat exchanger unit 223 is fixed to the sidewall 219 in the first embodiment, the heat exchanger unit 223 may not be fixed to the sidewall 219 as long as the heat exchanger unit 223 can be moved up and down. For example, an elevation mechanism not shown capable of moving the heat exchanger unit 223 up and down may be employed.

A channel structure 224 for adjusting a temperature of the wafer 200 is provided in the heat exchanger unit 223. The channel structure 224 is arranged to be parallel to the back side of the wafer 200. By supplying a thermal medium such as a coolant to the channel structure 224, the temperature of the wafer 200 is maintained uniformly.

Holes 225 into which the lamps 211 are inserted is provided in the heat exchanger unit 223. When the lamps 211 are lifted, the front ends of the lamps 211 are inserted into the holes 225.

A thermal medium supply pipe 226 and a thermal medium exhaust pipe 227 are connected to the channel structure 224. A thermal medium supply source 228, a flow rate controller 229 and a valve 230 are installed at the thermal medium supply pipe 226 in order from an upstream side to a downstream side of the thermal medium supply pipe 226. The thermal medium exhaust pipe 227 is connected to components such as a reservoir, for example.

The flow rate controller 229 and the valve 230 are electrically connected to the controller 310. The controller 310 is configured to control the flow rate controller 229 and the valve 230 to adjust the conditions such as the flow rate of the thermal medium supplied to the channel structure 224.

The heat exchanger unit 223 and the lamps 211 are collectively referred to as temperature controller. The temperature controller may include one of a component which moves the heat exchanger unit 223 up and down, a component which supplies the coolant to and exhausts the coolant from the heat exchanger unit 223, a component which controls the lamps 211, a component which moves the lamps 211 up and down and combinations thereof.

Gas Introduction Holes

A gas introduction hole 241, a gas introduction hole 242, a gas introduction hole 243 and a gas introduction hole 244 for supplying various gases into the process chamber 201 are provided at the ceiling of process vessel 202 in the shower head 250 provided at an upper portion of the process chamber 201. A gas supply system connected to the gas introduction hole 241, the gas introduction hole 242, the gas introduction hole 243 and the gas introduction hole 244 will be described later in detail.

Shower Head

The shower head 250, which is a gas dispersion mechanism in communication with the process chamber 201, is provided between the gas introduction holes 241, 242, 243 and 244 and the process chamber 201. The gases introduced through the gas introduction hole 241, the gas introduction hole 242, the gas introduction hole 243 and the gas introduction hole 244 is supplied into a buffer chamber 252 in the shower head 250. The buffer chamber 252 is surrounded by the process vessel 202 and a dispersion plate 254.

The shower head 250 includes the dispersion plate 254 disposed between the buffer chamber 252 and the process chamber 201 to disperse gases. Through-holes are provided at the dispersion plate 254. The dispersion plate 254 faces the wafer 200 from above the wafer 200. By supplying the gas via the dispersion plate 254, the gas may be supplied to the wafer 200 uniformly.

Supply System

The gas supply system connected to the gas introduction hole 241, the gas introduction hole 242, the gas introduction hole 243 and the gas introduction hole 244 will be described with reference to FIG. 2 through FIG. 5.

First Source Gas Supply System

As shown in FIG. 2, a first source gas supply system 260 is connected to the gas introduction hole 241. The first source gas supply system 260 includes a gas supply pipe 261. The gas supply pipe 261 is connected to the gas introduction hole 241 at the ceiling of the process vessel 202. A first gas source 262, a mass flow controller MFC 263 configured to adjust the flow rate of a first source gas, and a valve 264 are installed at the gas supply pipe 261 in order from an upstream side to a downstream side of the gas supply pipe 261. An inert gas supply pipe 265 joins the gas supply pipe 261 at the downstream side of the valve 264. An inert gas source 266, an MFC 267 and a valve 268 are installed at the inert gas supply pipe 265 in order from an upstream side to a downstream side of the inert gas supply pipe 265.

The first source gas is a gas containing a first element such as a zirconium-containing gas. In one embodiment, the first source gas may include Tetrakis(ethylmethylamido)zirconium ($Zr[N(C_2H_5)(CH_3)]_4$: TEMAZ). The inert gas is not reactive with the first source gas. For example, the inert gas may include nitrogen ($N_2$) gas. The inert gas is used as a carrier gas of the first source gas.

The gas supply pipe 261, the MFC 263 and the valve 264 are collectively referred to as "first source gas supply unit". The first source gas supply unit may include one of the inert gas supply pipe 265, the MFC 267, the valve 268, the first gas source 262, the inert gas source 266 and combinations thereof.

Reactive Gas Supply System

As shown in FIG. 3, a reactive gas supply system 270 is connected to the gas introduction hole 242. The gas supply system 270 includes a gas supply pipe 271. The gas supply pipe 271 is connected to the gas introduction hole 242 at the ceiling of the process vessel 202. A reactive gas source 272, a mass flow controller MFC 273 configured to adjust the flow rate of a reactive gas and a valve 274 are installed at the gas supply pipe 271 in order from an upstream side to a downstream side of the gas supply pipe 271. An inert gas supply pipe 275 joins the gas supply pipe 271 at the downstream side of the valve 274. An inert gas source 276, an MFC 277 and a valve 278 are installed at the inert gas supply pipe 275 in order from an upstream side to a downstream side of the inert gas supply pipe 275.

The reactive gas is reactive with the first source gas and a second source gas which is described later. The reactive gas may include an oxygen-containing gas. For example, reactive gas may be ozone gas. The inert gas is not reactive with the reactive gas. For example, the inert gas may include nitrogen ($N_2$) gas When the reactive gas is to be supplied in the plasma state, a plasma generating unit 279 may be provided on the downstream side of the valve 274 at the gas supply pipe 271, for example. The plasma generating unit 279 includes, for example, an ICP (Inductively Coupled Plasma) electrode having a coil. The plasma generating unit 279 converts the reactive gas passing through the gas supply pipe 271 into a plasma state.

The gas supply pipe 271, the MFC 273 and the valve 274 are collectively referred to as "reactive gas supply unit". The reactive gas supply unit may include one of the inert gas supply pipe 275, the MFC 277, the valve 278, the reactive gas source 272, the inert gas source 276, the plasma generating unit 279 and combinations thereof.

Second Source Gas Supply System

Figure 4:
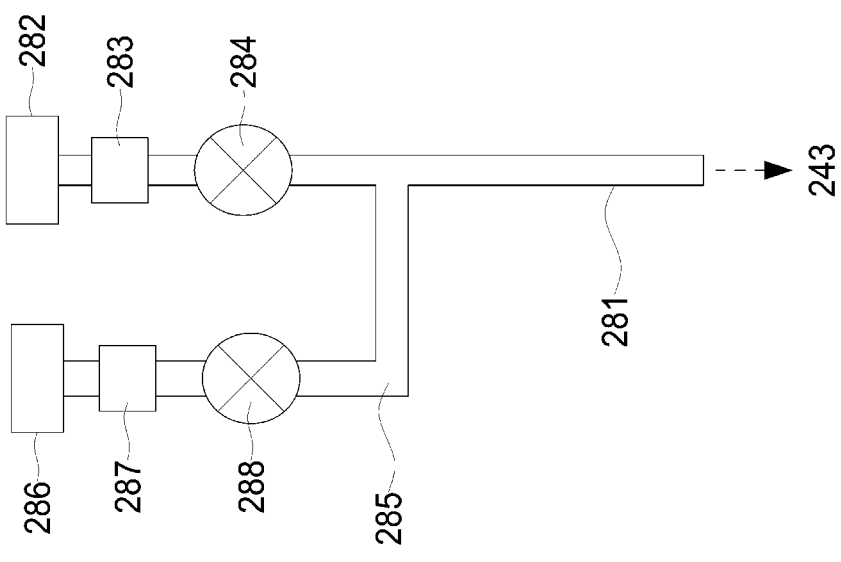
FIG. 4 illustrates a configuration of a second source gas supply system according to the embodiment.

As shown in FIG. 4, a second source gas supply system 280 is connected to the gas introduction hole 243. The second source gas supply system 280 includes a gas supply pipe 281. The gas supply pipe 281 is connected to the gas introduction hole 243 at the ceiling of the process vessel 202. A first gas source 282, a mass flow controller MFC 283 configured to adjust the flow rate of a second source gas, and a valve 284 are installed at the gas supply pipe 281 in order from an upstream side to a downstream side of the gas supply pipe 281. An inert gas supply pipe 285 joins the gas supply pipe 281 at the downstream side of the valve 284. An inert gas source 286, an MFC 287 and a valve 288 are installed at the inert gas supply pipe 285 in order from an upstream side to a downstream side of the inert gas supply pipe 285.

The second source gas is a gas containing a second element such as a aluminum-containing gas. In one embodiment, the second source gas may include aluminum chloride ($AlCl_3$). The inert gas is not reactive with the second source gas. For example, the inert gas may include nitrogen ($N_2$) gas.

The gas supply pipe 281, the MFC 283 and the valve 284 are collectively referred to as "second source gas supply unit". The second source gas supply unit may include one of the inert gas supply pipe 285, the MFC 287, the valve 288, the third gas source 282, the inert gas source 286 and combinations thereof.

Purge Gas Supply System

Figure 5:
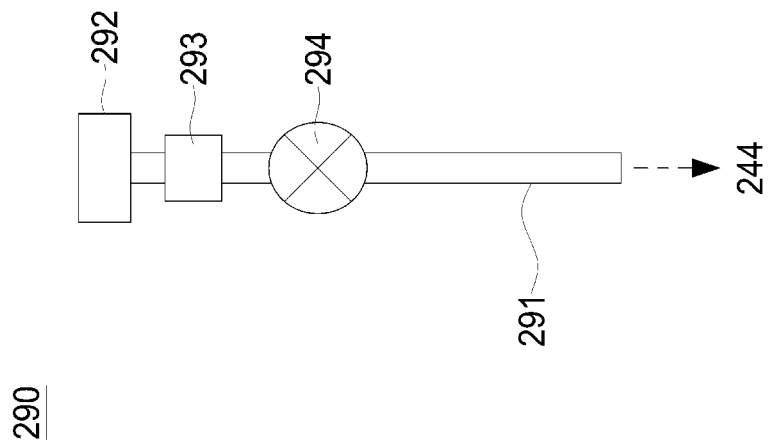
FIG. 5 illustrates a configuration of a purge gas supply system according to the embodiment.

As shown in FIG. 5, a purge gas supply system 290 is connected to the gas introduction hole 244. The purge gas supply system 290 includes a gas supply pipe 291. The gas supply pipe 291 is connected to the gas introduction hole 244 at the ceiling of the process vessel 202. A purge gas source 292, a mass flow controller MFC 293 configured to adjust the flow rate of a purge gas, and a valve 294 are installed at the gas supply pipe 291 in order from an upstream side to a downstream side of the gas supply pipe 291.

The purge gas is used for exhausting an inner atmosphere of the process chamber 201 in the substrate processing which is to be described later. The purge gas includes an inert gas such as nitrogen $N_2$ gas.

The gas supply pipe 291, the MFC 293 and the valve 294 are collectively referred to as "purge gas supply unit". The purge gas supply unit may further include a fourth gas source 292.

The MFCs and the valves of the above-described gas supply units, i.e. the first gas supply unit 260, the reactive gas supply unit 270, the second source gas supply unit 280 and the purge gas supply unit 290 are electrically connected to the controller 310, and controlled by the controller 310.

The combinations or all of the first gas supply unit 260, the reactive gas supply unit 270, the second source gas supply unit 280 and the purge gas supply unit 290 are referred to as "gas supply unit".

Exhaust System

An exhaust port 245 for exhausting the inner atmosphere of the process vessel 202 is provided on the inner surface of the side wall of the process vessel 202. An exhaust pipe 246 is connected to the exhaust port 245 at the outer surface of the side wall of the process vessel 202. A pressure controller 247 such as APC Automatic Pressure Controller and a vacuum pump 248 configured to control the inner pressure of the process chamber 201 are provided at the exhaust pipe 246 in series. The exhaust port 245, the exhaust pipe 246 and the pressure controller 247 are collectively referred to as "exhaust unit". The exhaust unit may further include a vacuum pump 248.

Controller

The substrate processing apparatus 100 includes the controller 310 configured to control the components of the substrate processing apparatus 100. The controller 310 may be also referred to as "apparatus control unit".

Figure 6:
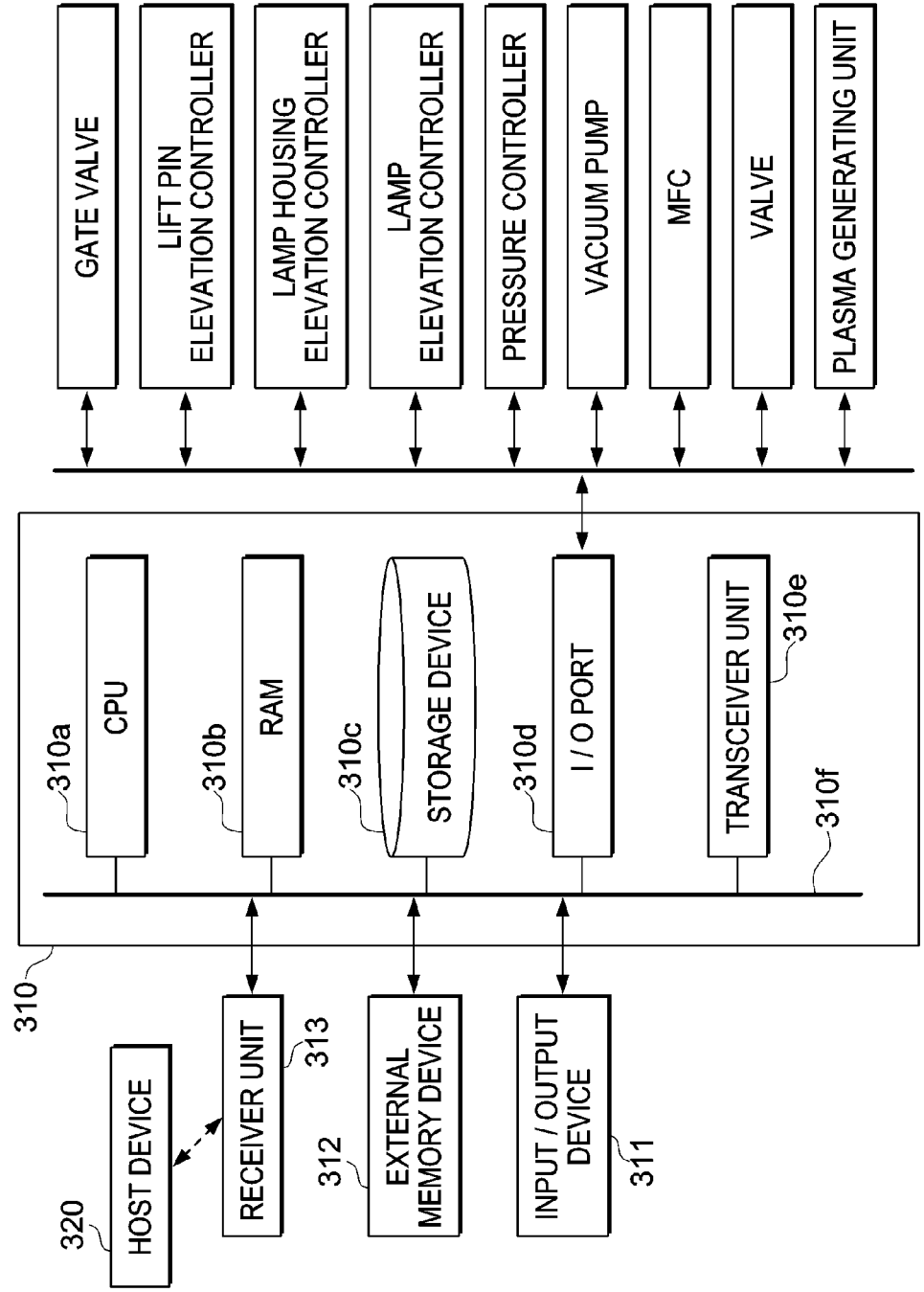
FIG. 6 schematically illustrates a configuration of a controller according to the embodiment.

FIG. 6 schematically illustrates the configuration of the controller 310. FIG. The controller 310 which is a control unit may be embodied by a computer including a central processing unit (CPU) 310a, a random access memory (RAM) 310b, a storage device 310c, an I/O port 310d and a transceiver unit 310e. The RAM 310b, the storage device 310c and the I/O port 310d can exchange data with the CPU 310a via an internal bus 310f The transmission or reception of data in the substrate processing apparatus 100 is performed according to the instruction of the transceiver unit 310e.

For example, an external memory device 312 and an input/output device 311 such as a touch panel may be connected to the controller 310. A receiver unit 313 may be connected to the host device 320 via a network. The receiver unit 310 is capable of receiving information of a device different from the substrate processing apparatus 100 through the host device 320.

The storage device 310c may be embodied by components such as flash memory and HDD (Hard Disk Drive). A control program for controlling the operation of the substrate processing apparatus; and a process recipe in which information such as orders and conditions of the substrate processing is stored are readably stored in the storage device 310c. The process recipe is a program that is executed in the controller 210 to obtain a predetermined result by performing sequences of the substrate processing. Hereinafter, the process recipe and the control program are collectively referred to simply as "program". The term "program" may refer to only the process recipe, only the control program, or both. The RAM 310b is a work area in which data such as the program and data read by the CPU 310a are temporarily stored.

I/O port 310d is connected to the components of the substrate processing apparatus 100 such as the gate valve 204, the lift pin elevation controller 208, the lamp elevation controller 215, the lamp housing elevation controller 222, the pressure controller 247 and the vacuum pump 248.

The CPU 310a is configured to read and execute the control program stored in the storage device 310c, and read the process recipe in accordance with an instruction such as an operation command inputted from the input/output device 311. The CPU 310a may be configured to perform the opening and closing operations of the gate valve 204, the operation of the lift pin elevation controller 208, the operation of the lamp housing elevation controller 222, the operations of the pressure controller 247 and the operation of the vacuum pump 248.

The controller 310 may be embodied by a dedicated computer or a general purpose computer. The controller 310 of the first embodiment may be embodied by preparing the external memory device 312 (e.g. magnetic tapes, magnetic disks such as flexible disk and hard disk, optical disks such as CD and DVD, magneto-optical disks such as MO, and semiconductor memories such as USB memory and memory card) and installing the program on the general purpose computer using the external memory device 312. The method of providing the program to the computer is not limited to the external memory device 312. The program may be directly provided to the computer using a communication means without using the external memory device 312. The storage device 310c or the external memory device 312 may be embodied by a computer-readable recording medium. Hereinafter, the storage device 310c and the external memory device 312 may be collectively referred to as recording medium. Hereinafter, the term "recording medium" may refer to only the storage device 310c, only the external memory device 312, or both.

(2) Substrate Processing

Figure 7:
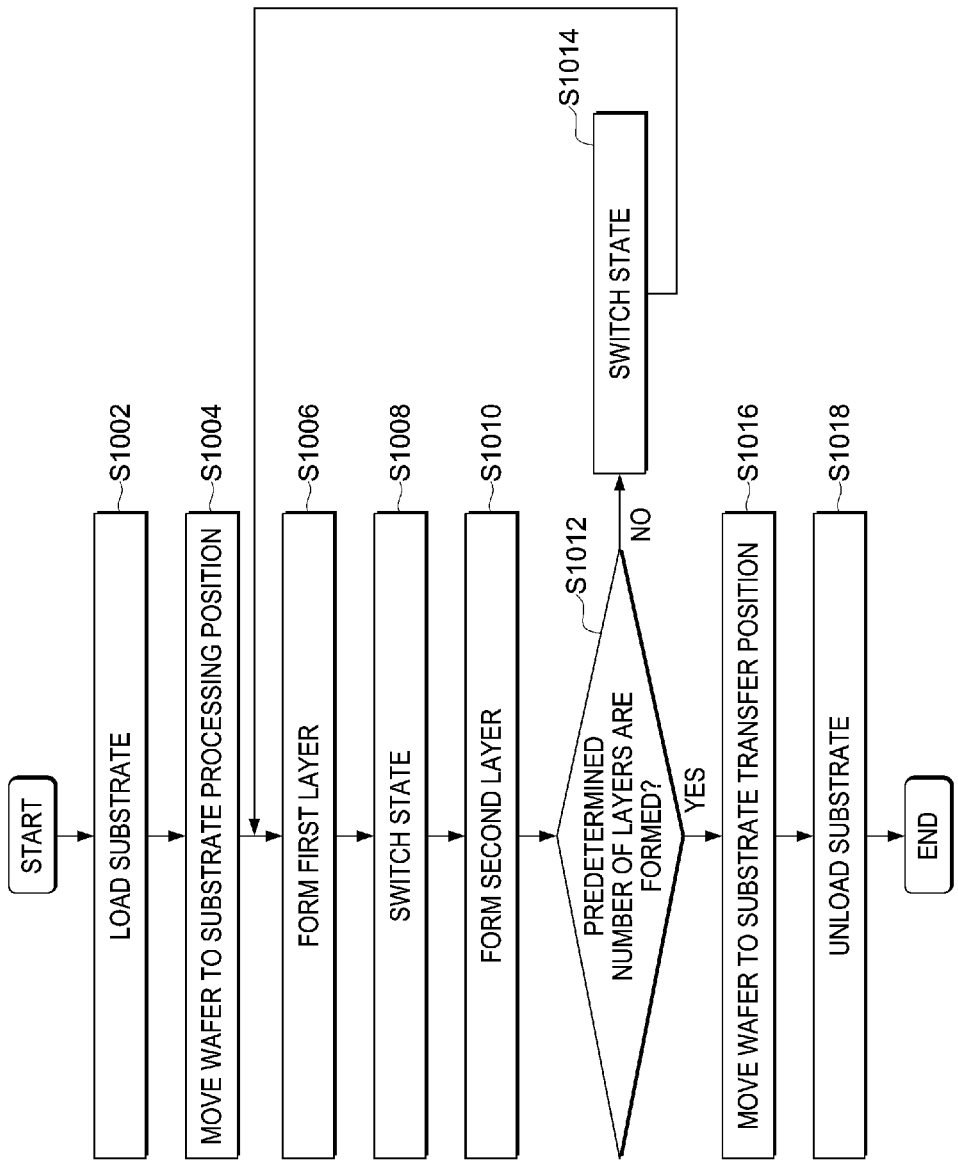
FIG. 7 illustrates film-forming sequence in a substrate processing according to the embodiment.
Figure 8:
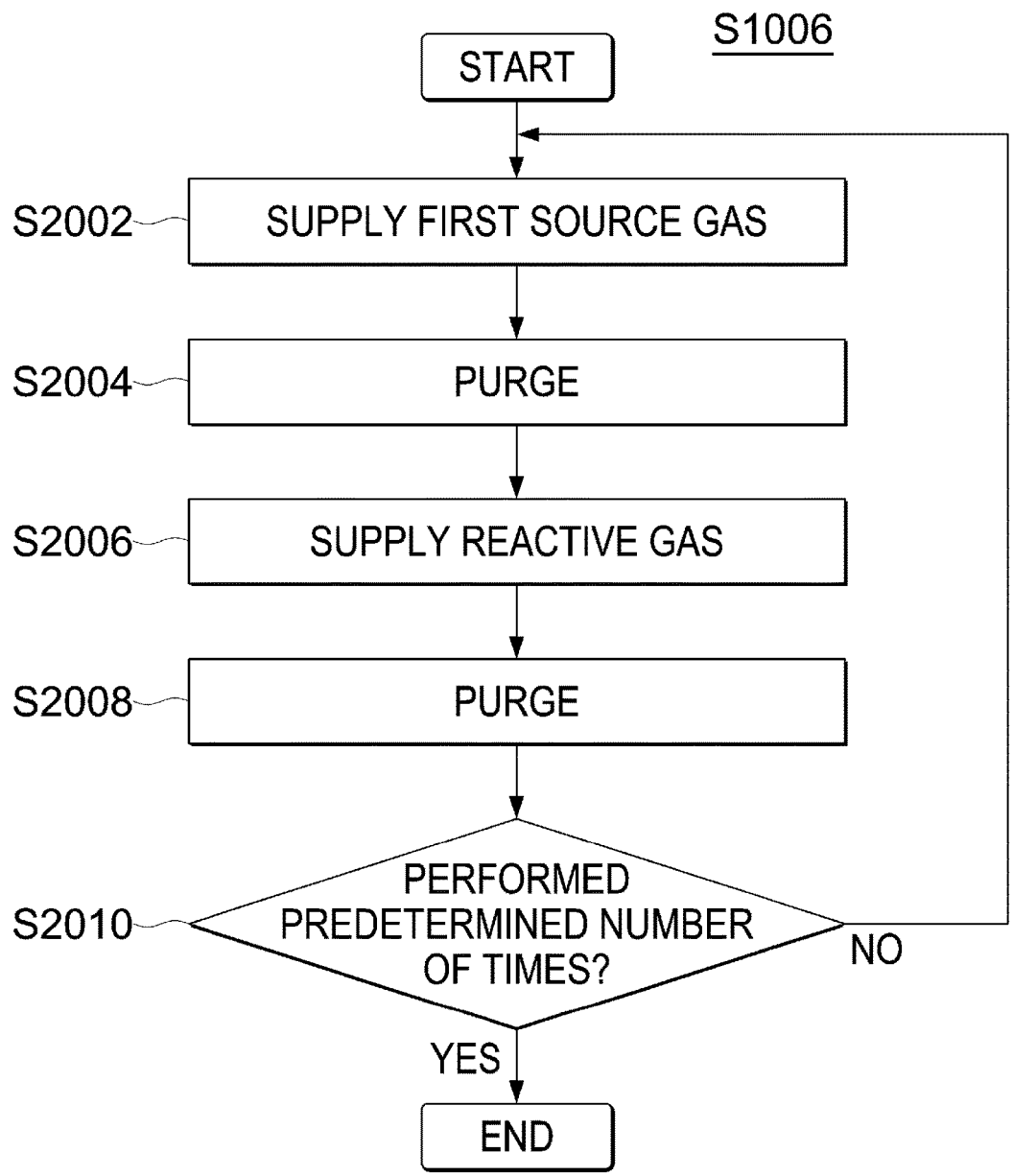
FIG. 8 illustrates a flow of film formation in a substrate processing according to the embodiment.
Figure 9:
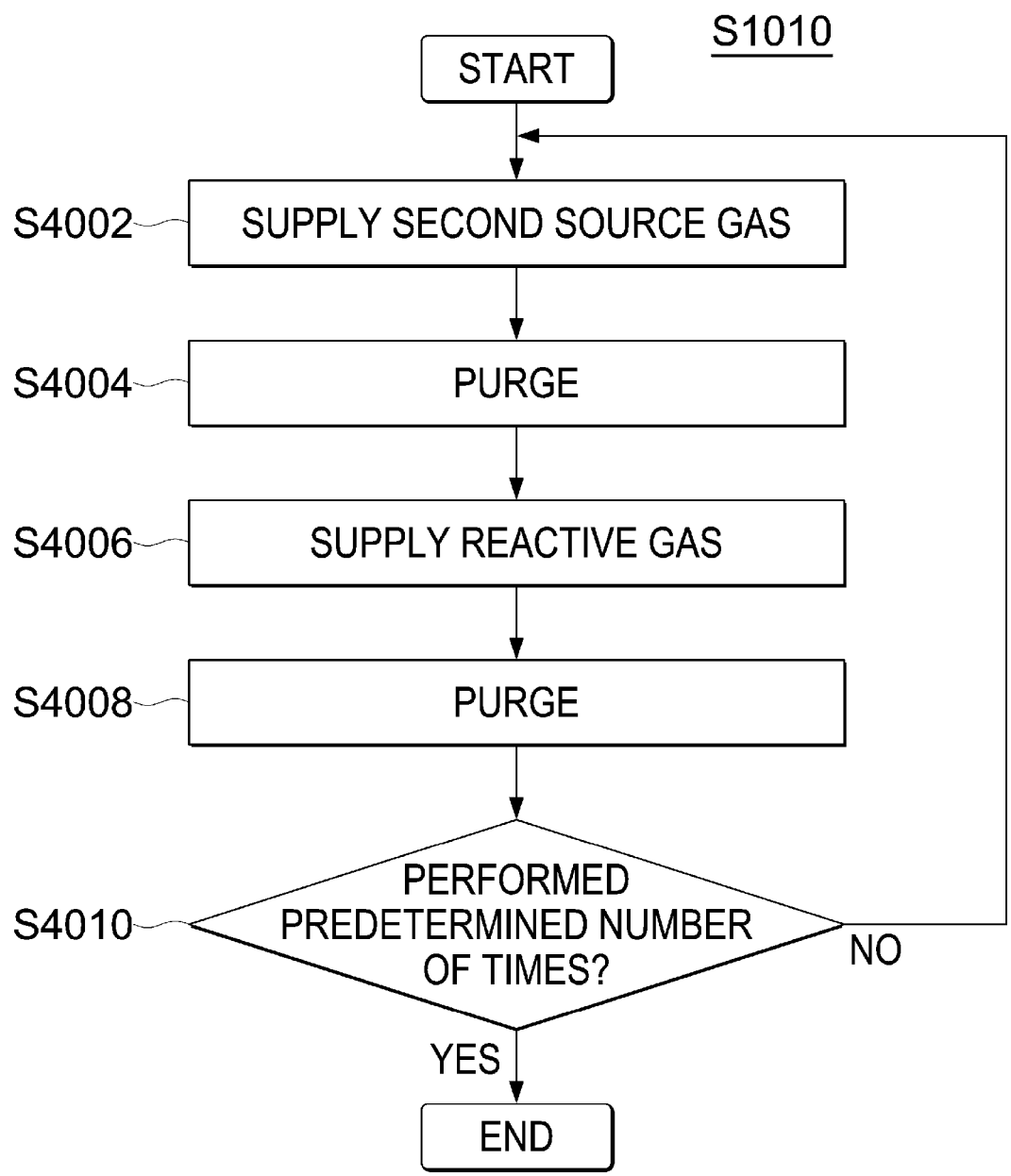
FIG. 9 illustrates a flow of film formation in a substrate processing according to the embodiment.

Hereinafter, a substrate processing for forming a film including a laminated structure on the wafer using the above-described substrate processing apparatus 100 will be described with reference to FIG. 7 through FIG. 12. FIG. 7 exemplifies film-forming sequence in a substrate processing according to the first embodiment, FIG. 8 illustrates a first layer forming process for forming a first layer according to the first embodiment, FIG. 9 illustrates a second layer forming process for forming a second layer forming process according to the first embodiment, FIG. 10A through FIG. 10E illustrate an operation of the substrate processing apparatus 100 when each step shown in FIG. 7 are performed in order. The substrate processing apparatus 100 shown in FIG. 1 is simplified and partially depicted in FIG. 10A through FIG. 10E. In the description below, the components of the substrate processing apparatus 100 are controlled by the controller 310.

The substrate processing will be exemplified by an example wherein the ZAZ film including ZrOx/AlO/ZrOx laminated structure is formed using TEMAZ gas, AlCl$_3$ gas and ozone gas as a first element-containing gas, second element-containing gas and a reactive gas, respectively.

Substrate Loading Step S1002

Figure 10A:
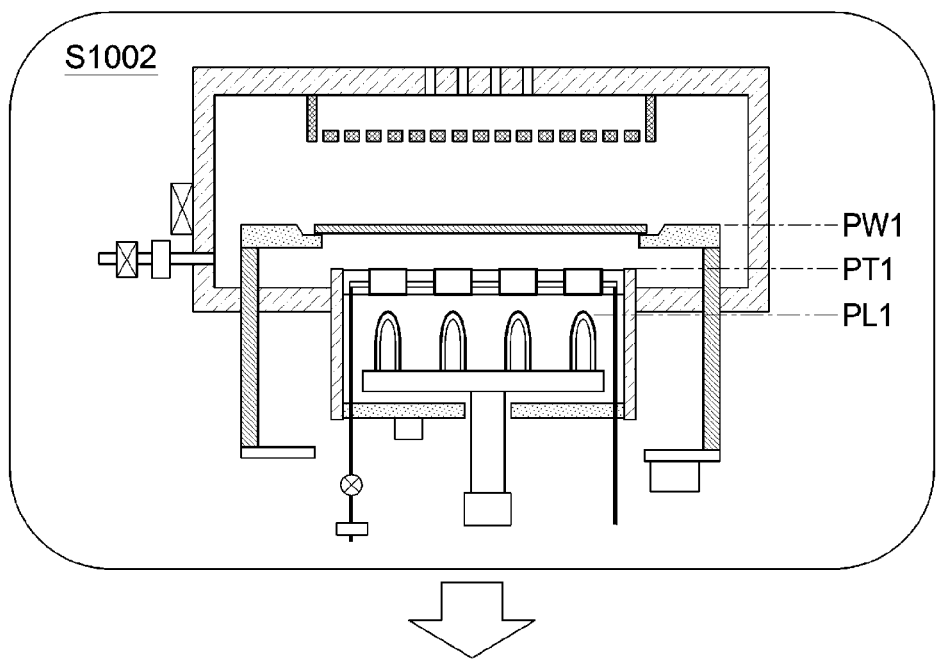
FIG. 10A through FIG. 10E illustrate an operation of the substrate processing apparatus according to the embodiment.

The fingers 206 of the substrate processing apparatus 100 is lowered to a transfer position of the wafer 200, which is shown in FIG. 10A. Thereafter, the gate valve 204 is opened, and the wafer (substrate) 200 is loaded into the process chamber 201 by a wafer transfer device not shown. The wafer 200 is then placed on the fingers 206 horizontally.

After the wafer 200 is loaded into the process vessel 202, the wafer transfer device not shown is retracted to the outside of the process vessel 202. The gate valve 204 is closed, and the inside of the process vessel 202 is sealed. At this time, the wafer 200 is at the wafer transfer position PW1, the upper end of the heat exchanger unit 223 is at the position PT1, and the lamps 211 are at the position PL1.

Opening and closing of the valve 230 or on and off of the lamps 211 are performed according to the processing of the wafer 200. For example, when wafer 200 is to be heated promptly due throughput, the lamps may be turned on to heat the wafer 200 after the gate valve 204 is closed. When the temperature is to be adjusted, the valve 230 may be opened to supply the coolant to the channel structure 224.

Step S1004 for Moving the Wafer to the Substrate Processing Position

Figure 10B:
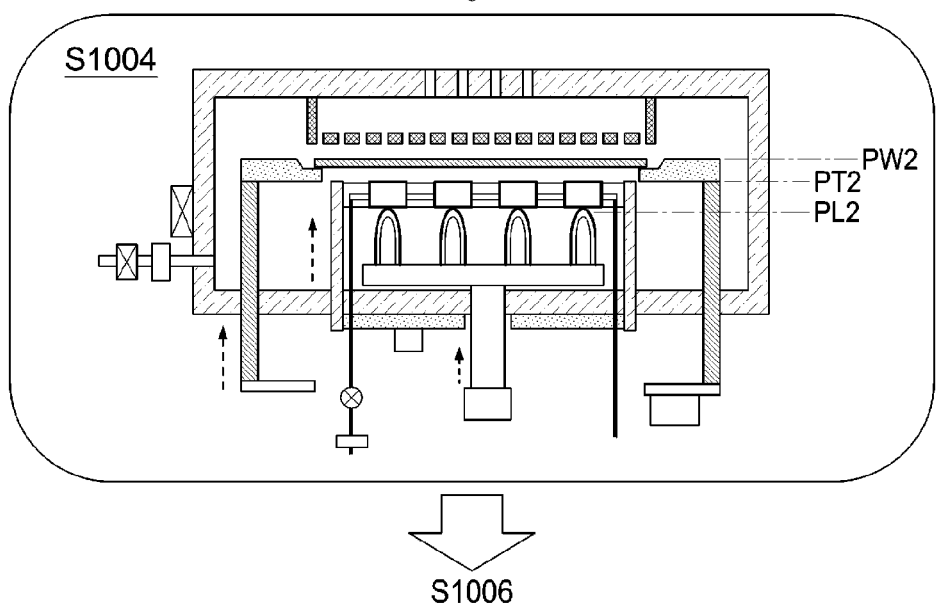

As shown in FIG. 10B, the wafer 200 is moved to the substrate processing position PW2 by elevating the fingers 206. Simultaneously, the channel structure 224 is elevated by moving the lamp housing 210 upward until the distance between the back side of the wafer 200 and the channel structure 224 reaches a predetermined distance. At this time, the upper end of the heat exchanger unit 223 is at the position PT2. The lamps 211 are elevated by moving the lamp support unit 213 upward until the distance between the back side of the wafer 200 and the lamps 211 reaches a predetermined distance.

First Layer Forming Step S1006

Figure 10C:
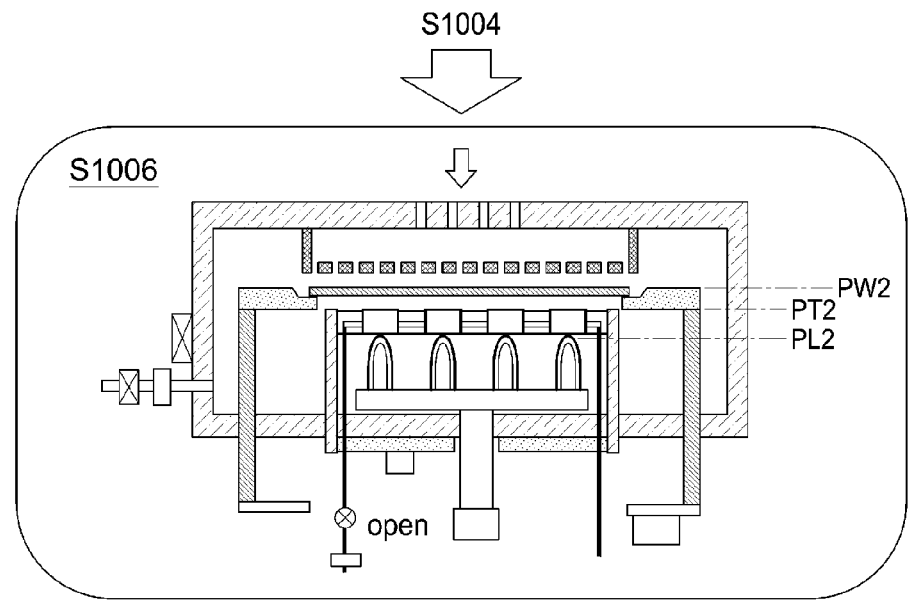

In the first layer forming step S1006, TEMAZ gas and ozone gas are alternately supplied into the process chamber 201. As shown in FIG. 10C, the wafer 200 is at the substrate processing position PW2, the upper end of the heat exchanger unit 223 is at the position PT2, and the front ends of the lamps 211 are at the position PL2. A ZrO film, which is the first layer, is formed in the first layer forming step S1006.

At this time, the coolant is circulated by opening the valve 230 to supply the coolant to the channel structure 224 and exhausting the coolant which has passed through the channel structure 224. The lamps 211 radiate heat at a predetermined time interval to heat the wafer 200 from the back side thereof. In the first layer forming step S1006, the temperature of the wafer 200 is maintained at a first temperature.

The position PT2 is higher than the position PL2 such that the temperature of the wafer 200 in the first layer forming step S1006 is higher than that of the wafer 200 in a second layer forming step S1010 to be described later. As a result, the distance between the channel structure 224 and the wafer 200 is shorter than the distance between the lamps 211 and the wafer 200. This facilitates maintaining the wafer at a low temperature since the channel structure 224 can affect the temperature of the wafer 200 more.

More preferably, position PT2 and position PL2 may selected such that the front ends of the lamps 211 is lower than the lower end of the heat exchanger unit 223. As a result, the heat radiated toward the wafer 200 may be blocked by the heat exchanger unit 223. This allows the effect of heat exchanger unit 223 to be more dominant than that of the heat radiated from the lamps 211.

In the first layer forming step S1006, the wafer 200 is maintained at a predetermined temperature due to the cooling by the channel structure 224 and the heating by the lamps 211. The temperature of the wafer 200 ranges from 300° C. to 400° C., and may be 350° C., preferably.

The method of forming the ZrO film will be described in detail with reference to FIG. 8.

First Source Gas Supply Step S2002

When the temperature of the wafer 200 reaches a desired temperature by the cooling by the channel structure 224 and the heating by the lamps 211, the valve 264 is opened. A mass flow controller 243c adjusts the flow rate of TEMAZ gas to a predetermined value. The flow rate of TEMAZ gas ranges from 100 sccm to 5000 sccm. At this time, the valve 268 is also opened to supply N$_2$ gas through the inert gas supply pipe 265.

TEMAZ gas is supplied to the wafer 200 via the process chamber 201. When TEMAZ gas contacts the surface of the wafer 200, a zirconium-containing layer, which is a first element-containing layer or simply first layer, is formed on the surface of the wafer 200.

The zirconium-containing layer has a predetermined thickness and a predetermined distribution according to conditions such as the inner pressure of the process vessel 202, the flow rate of TEMAZ gas, the temperature of the wafer 200 and time taken by TEMAZ gas to pass through the process chamber 201.

The valve 264 is closed after a predetermined time to stop the supply of TEMAZ gas.

Purge Step S2004

Thereafter, the shower head 250 and the process chamber 201 are purged by supplying N$_2$ gas through the supply pipe 291. As a result, TEMAZ gas which did not participate in the chemical reaction with the wafer 200 in the first source gas supply step S2002 is removed from the process chamber 201 via exhaust pipe 246 by the vacuum pump 248.

Reactive Gas Supply Step S2006

After the purge step S2004 is performed, the valve 274 is opened to supply ozone gas, which is the reactive gas, into the process chamber 201 via the shower head 250.

A mass flow controller 244c adjusts the flow rate of ozone gas to a predetermined value. The flow rate of ozone gas may range from 100 sccm to 5000 sccm. N$_2$ gas, which is a carrier gas, may be also supplied through the supply pipe 275 while ozone gas is supplied.

Ozone gas is supplied onto the wafer 200. The zirconium-containing layer already formed on the wafer 200 is modified by ozone gas, and a zirconium/oxygen-containing layer containing zirconium and oxygen is formed on the wafer 200.

The zirconium/oxygen-containing layer has a predetermined thickness, a predetermined distribution and a predetermined oxygen penetration depth according to conditions such as the inner pressure of the process vessel 202, the flow rate of the oxygen-containing gas and the temperature of the wafer 200.

The valve 274 is closed after a predetermined time to stop the supply of the oxygen-containing gas.

Purge Step S2008

Thereafter, the purge step S2008 same as the purge step S2004 is performed. Since the operations of the components of the substrate processing apparatus 100 in the purge step S2008 are same as that of the purge step S2004, a detailed description is omitted.

Determination Step S2010

The controller 310 determines whether a cycle including the first source gas supply step S2002, the purge step S2004, the reactive gas supply step S2006 and the purge step S2008 is performed a predetermined number of times (n times).

When the cycle is determined to be not performed the predetermined number of times in the determination step S2010 ("No" in the determination step S2010), the cycle including the first source gas supply step S2002, the purge step S2004, the reactive gas supply step S2006 and the purge step S2008 is further repeated. When the cycle is determined to be performed the predetermined number of times in the determination step S2010 ("Yes" in the determination step S2010), the first layer forming step S1006 shown in FIG. 8 is no longer performed. Since performing the cycle the predetermined number of times means that the ZrO film having a desired thickness is formed, a state switching step S1008 shown in FIG. 7 is then performed.

State Switching Step S1008

In the state switching step S1008 which is performed after the first layer forming step S1006 and before the second layer forming step S1010, the state of the substrate processing apparatus 100 is switched. A detailed description is given below.

Figure 10D:
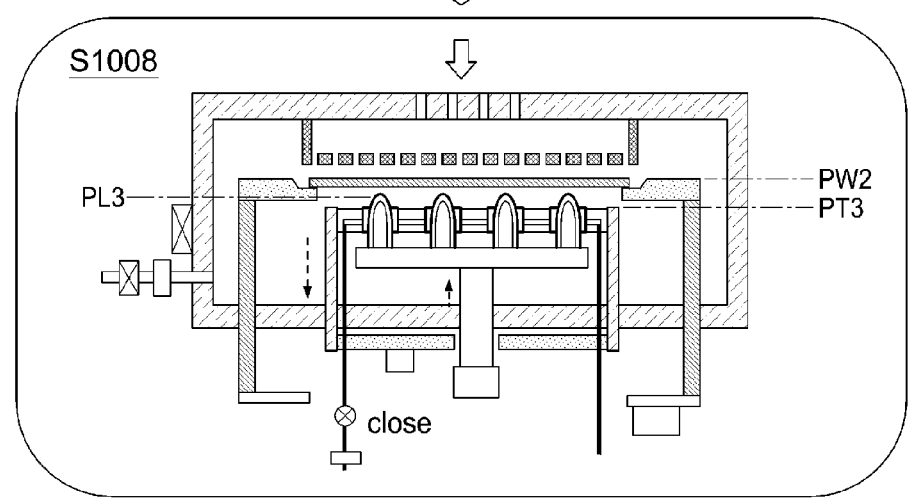

After the first layer forming step S1006 is completed, the purge gas is continuously supplied. At this time, the controller 310 controls the operations of the lamps 211 and other components to switch the state of the substrate processing apparatus 100 such that the wafer 200 is at a temperature suitable for the second layer forming step S1010. For example, when the temperature of the wafer 200 suitable for the second layer forming step S1010 is higher than the temperature of the wafer 200 suitable for the first second layer forming step S1006, the controller 310 controls the lamps 211 and other components in a manner that the time interval between the radiations of the lamps 211 is shorter than the time interval between the radiations of the lamps 211 in the first layer forming step S1006, the amount of heat radiated from the lamps 211 is greater than the amount of heat radiated from the lamps 211 in the first layer forming step S1006, or the distance between the front ends of the lamps 211 and the wafer 200 is shorter than the distance between the front ends of the lamps 211 and the wafer 200 in the first layer forming step S1006 by moving the lamps 211 to the position PL3. As shown in FIG. 10D, the distance between the channel structure 224 and the wafer 200 may be increased by lowering the lamp housing 210 until the upper end of the heat exchanger unit 223 is at the position PT3. Since the heat exchanger unit 223 is provided with holes 225 which the lamps 211 pass through, the front ends of the lamps 211 does not come in contact with the heat exchanger unit 223 and the lamp housing 210 may be lowered.

More preferably, the position PT3 and the position PL3 are selected such that the front ends of the lamps 211 are higher than the upper end of the heat exchanger unit 223. This configuration prevents the blocking of heat from the lamps 211 toward the wafer 200 by the heat exchanger unit 223, thereby making the effect of the heat from the lamps 211 toward the wafer 200 dominant.

The configuration described above improves the efficiency of adjusting the temperature of the wafer 200. Closing the valve 230 to stop the supply of coolant further improves the efficiency of heating the wafer 200.

When the temperature of the wafer 200 suitable for the second layer forming step S1010 is lower than the temperature of the wafer 200 suitable for the first second layer forming step S1006, the controller 310 controls the lamps 211 and other components in a manner that the time interval between the radiations of the lamps 211 is longer than the time interval between the radiations of the lamps 211 in the first layer forming step S1006, or the amount of heat radiated from the lamps 211 is smaller than the amount of heat radiated from the lamps 211 in the first layer forming step S1006. It is preferable that the lamp housing 210 is not lowered to improve the efficiency of adjusting the temperature of the wafer 200.

Second Layer Forming Step S1010

Hereinafter, the second layer forming step S1010 is described. An example wherein the temperature of the wafer 200 suitable for the second layer forming step S1010 is higher than the temperature of the wafer 200 suitable for the first layer forming step S1006 is described. The processes below are performed while maintaining the state and the temperature set in the state switching step S1008.

Figure 10E:
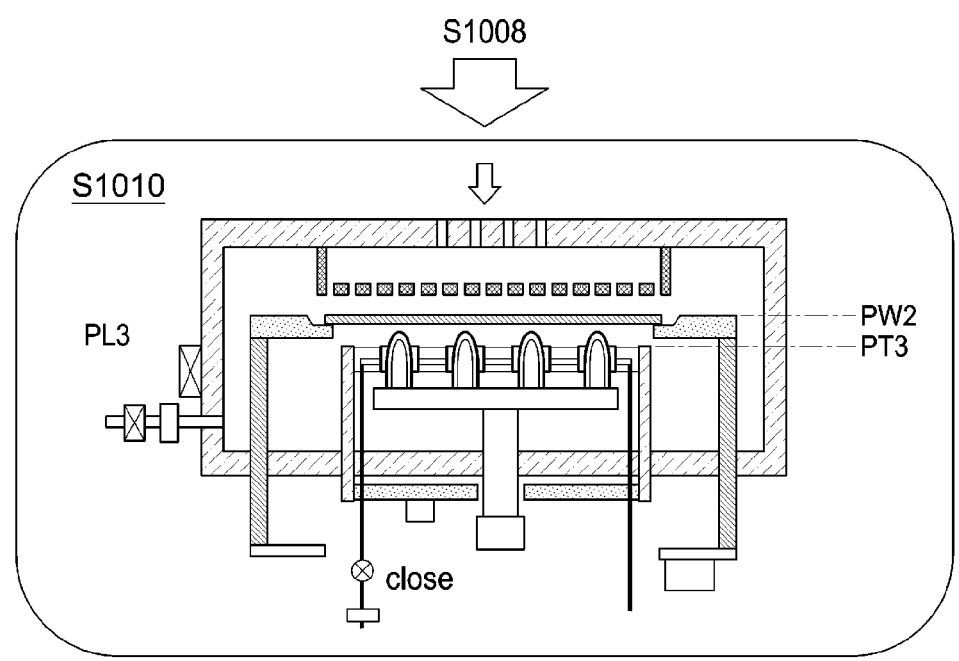

In the second layer forming step S1010, an AlO film, which is the second layer, is formed. In the second layer forming step S1010, $AlCl_3$ and ozone gas are alternately supplied into the process chamber 201. As shown in FIG. 10E, the wafer 200 is at the substrate processing position PW2, the upper end of the heat exchanger unit 223 is at the position PT3, and the front ends of the lamps 211 are at the position PL3.

The coolant is circulated by opening the valve 230 to supply the coolant to the channel structure 224 and exhausting the coolant which has passed through the channel structure 224. The lamps 211 radiate heat at constant time interval to heat the wafer 200 from the back side thereof. In the second layer forming step S1010, the wafer 200 is maintained at a second temperature. The time interval varies depending on the target temperature of the wafer. Thus, the time interval of the second layer forming step S1010 may differ from that of the first layer forming step S1006.

The cooling by the channel structure 224 and the heating by the lamps 211 maintain the wafer 200 at a predetermined temperature. The temperature of the wafer 200 may range from 400° C. to 500° C., preferably 450° C.

The method of forming the AlO film will be described in detail with reference to FIG. 9.

Second Source Gas Supply Step S2002

When the wafer 200 is heated to an reaches a desired temperature, the valve 284 is opened. The mass flow controller 283 adjusts the flow rate of $AlCl_3$ gas, which is the second source gas to a predetermined value. The flow rate of $AlCl_3$ gas ranges from 100 sccm to 5000 sccm. At this time, the valve 288 is also opened to supply $N_2$ gas through the inert gas supply pipe 285.

$AlCl_3$ gas is supplied to the wafer 200 via the process chamber 201. When $AlCl_3$ gas contacts the surface of the wafer 200, an aluminum-containing layer, which is a second element-containing layer or simply first layer, is formed on the surface of the wafer 200.

The aluminum-containing layer has a predetermined thickness and a predetermined distribution according to conditions such as the inner pressure of the process vessel 202, the flow rate of $AlCl_3$ gas, the temperature of the wafer 200 and time taken by $AlCl_3$ gas to pass through the process chamber 201.

The valve 284 is closed after a predetermined time to stop the supply of $AlCl_3$ gas.

Purge Step S4004

Thereafter, the shower head 250 and the process chamber 201 are purged by supplying $N_2$ gas through the supply pipe 291. As a result, $AlCl_3$ gas which did not participate in the chemical reaction with the wafer 200 in the second source gas supply step S4002 is removed from the process chamber 201 via exhaust pipe 246 by the vacuum pump 248.

Reactive Gas Supply Step S4006

After the purge step S4004 is performed, the valve 274 is opened to supply ozone gas, which is the reactive gas, into the process chamber 201 via the shower head 250.

The mass flow controller 244c adjusts the flow rate of ozone gas to a predetermined value. The flow rate of ozone gas may range from 100 sccm to 5000 sccm. $N_2$ gas, which is a carrier gas, may be also supplied through the supply pipe 275 while ozone gas is supplied.

Ozone gas is supplied onto the wafer 200. The aluminum-containing layer already formed on the wafer 200 is modified by ozone gas, and an aluminum/oxygen-containing layer containing aluminum and oxygen is formed on the wafer 200.

The aluminum/oxygen-containing layer has a predetermined thickness, a predetermined distribution and a predetermined oxygen penetration depth according to conditions such as the inner pressure of the process vessel 202, the flow rate of the oxygen-containing gas and the temperature of the wafer 200.

The valve 274 is closed after a predetermined time to stop the supply of the oxygen-containing gas.

Purge Step S4008

Thereafter, the purge step S4008 same as the purge step S4004 is performed. Since the operations of the components of the substrate processing apparatus 100 in the purge step S4008 are same as that of the purge step S4004, a detailed description is omitted.

Determination Step S4010

The controller 310 determines whether a cycle including the second source gas supply step S4002, the purge step S4004, the reactive gas supply step S4006 and the purge step S4008 is performed a predetermined number of times (n times).

When the cycle is determined to be not performed the predetermined number of times in the determination step S4010 ("No" in the determination step S4010), the cycle including the second source gas supply step S4002, the purge step S4004, the reactive gas supply step S4006 and the purge step S4008 is further repeated. When the cycle is determined to be performed the predetermined number of times in the determination step S4010 ("Yes" in the determination step S4010), the second layer forming step S1006 shown in FIG. 9 is no longer performed. Since performing the cycle the predetermined number of times means that the AlO film having a desired thickness is formed, a determination step S1012 shown in FIG. 7 is performed.

Determination Step S1012

After the second layer forming step S1010 is performed, the determination step S1012 is performed. In the determination step S1012, the number of the first layers and the number of the second layers are determined. For example, by counting the number of the first layer forming step S1006 performed and the number of the second layer forming step S1010 performed, the number of the first layers and the number of the second layers can be determined.

When the number of the first layers and the number of the second layers are determined to be a predetermined number in the determination step S1012, i.e. a desired number ("Yes" in the determination step S1012), a step S1016 for moving the wafer 200 to a substrate transfer position is performed. When the number of the first layers and the number of the second layers are determined to be less than the desired number ("No" in the determination step S1012), the state switching step S1014 is performed.

State Switching Step S1014

The state switching step S1014 is performed when the number of the first layers and the number of the second layers in the laminated structure are determined to be less than the desired number in the determination step S1012. In the state switching step S1014, the process condition is switched to one similar to the state switching step S1008. That is, in the first embodiment, the state of the substrate processing apparatus 100 is switched from one shown in FIG. 10E to one shown in FIG. 10C in the state switching step S1014. Thereafter, the first layer forming step S1006 is performed again.

Step S1016 for Moving the Wafer to the Substrate Transfer Position

When the number of the first layers and the number of the second layers in the laminated structure are determined to be the desired number, the step S1016 for moving the wafer 200 to the substrate transfer position is performed. In the step S1016, the controller 310 controls the components such as the fingers 206 in a reverse order of the step S1004 wherein the wafer 200 is moved to the substrate processing position such that fingers 206 is in position shown in FIG. 10A.

Substrate Unloading Step S1018

When the wafer 200 is moved to the position shown in FIG. 10A, the controller 310 controls the components in a reverse order of the substrate loading step S1002 to unload the wafer 200 from the substrate processing apparatus 100.

While the first embodiment is described by exemplifying the ZAZ film including ZrOx/AlO/ZrOx laminated structure, the first embodiment is not limited thereto. For example, the method according to the first embodiment may further include changing the temperature of the wafer when forming the first and second layers. The first embodiment may also be applied to forming different laminate structures using different gases or materials.

While the first embodiment is described by exemplifying the formation of two layers including the first layer and the second layer, the first embodiment is not limited thereto. For example, the first embodiment may also be applied to the formation of three or more layers.

While the first embodiment is described by exemplifying the formation of the ZAZ structure using TEMAZ gas, ozone gas and $AlCl_3$ gas, the first embodiment is not limited thereto. When the temperature of the wafer is properly changed during the formation of the first layer and the second layer, different zirconium-containing gases, oxygen-containing gases, aluminum-containing gases may be used.

However, since $AlCl_3$ gas described in the first embodiment provides better step coverage in processes performed in the relatively high temperature range between 400° C. and 500° C. than other aluminum-containing gases such as trimethylaluminum ((CH$_3$)$_3$Al: TMA) gas, it is preferable to use AlCl$_3$ gas in processes that require better step coverage.

While the first embodiment is described based on an example wherein the lamp housing 211 is in communication with the process chamber 201, the first embodiment is not limited thereto. For example, the lamp housing 211 may be provided with a window to prevent a gas from entering the lamp housing 211. A modified first embodiment will be described with reference to FIG. 11.

Figure 11:
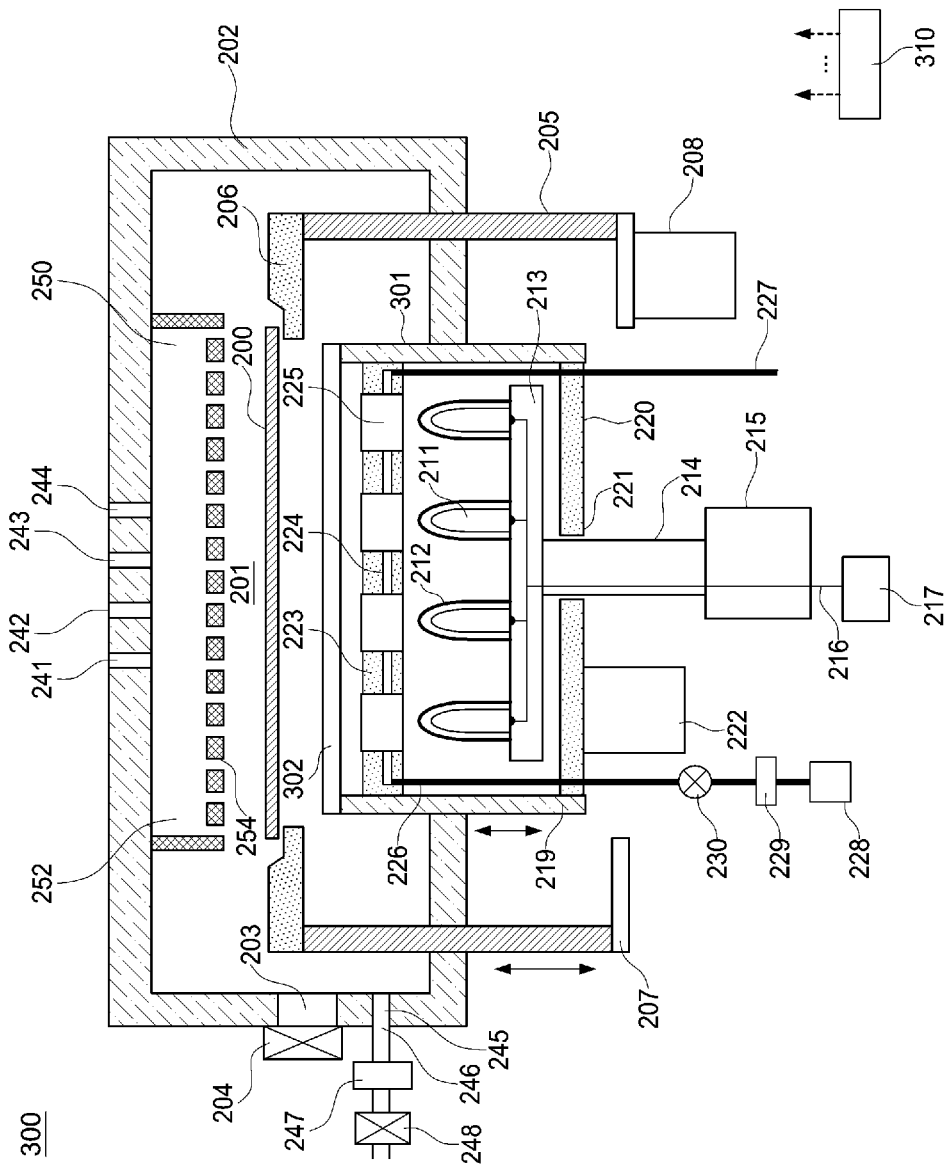
FIG. 11 illustrates a cross-section of a substrate processing apparatus according to a modified embodiment.
Figure 12:
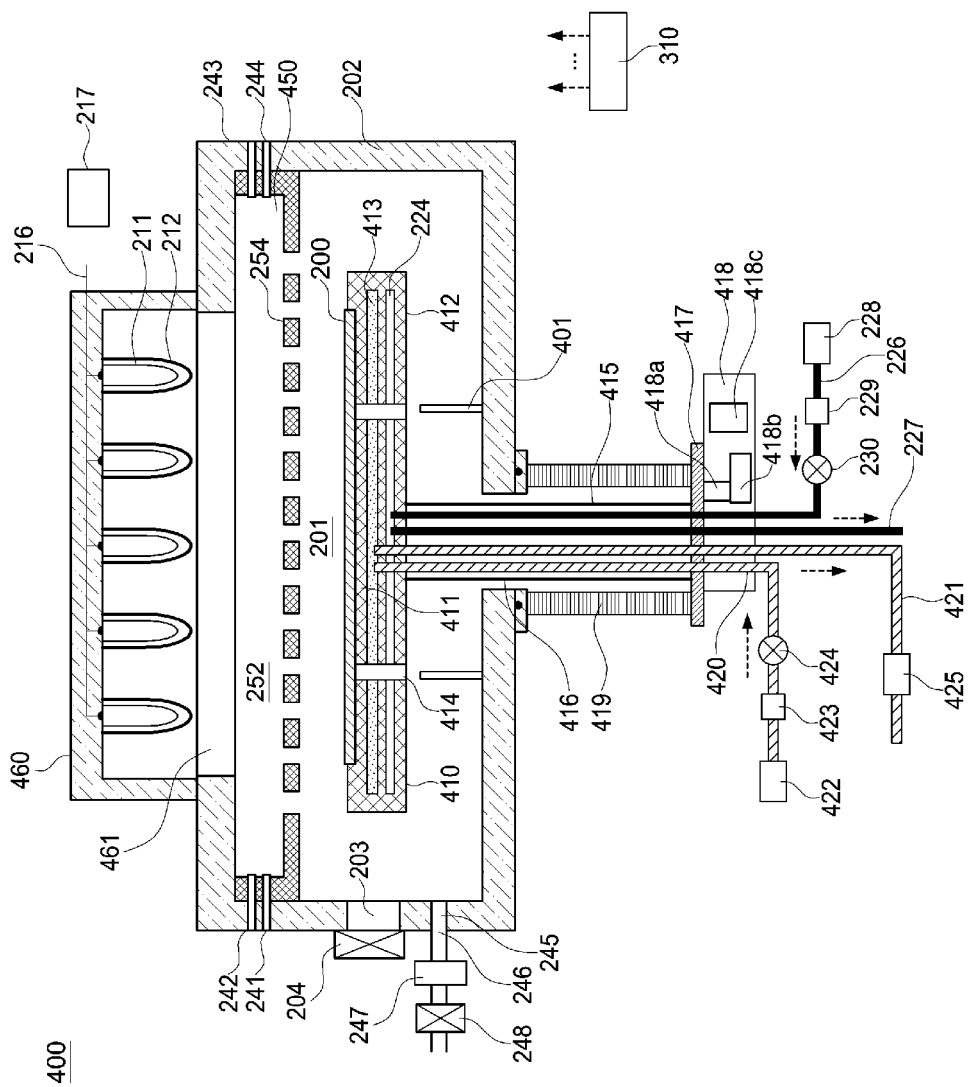
FIG. 12 illustrates a cross-section of a substrate processing apparatus according to another embodiment described herein.

The substrate processing apparatus 100 shown in FIG. 11 differs from substrate processing apparatus 100 shown in FIG. 1 in that a window 302 is provided at the upper end of the sidewall 219 of the lamp housing 301.

The window 302 is vacuum-resistant, and does not block the heat radiated from lamps 211. For example, the window 302 is made of quartz. window 302 is provided on the top of cylindrical sidewall 219 to cover the sidewall 219, and prevents gas from entering the lamp housing 301.

The window 302 prevents the adhesion of gas to lamp cover 212 and heat exchanger unit 223 even when the gas flows under the wafer 200 in the first layer forming step S1006 and the second layer forming step S1010. As a result, the degradations of the heating efficiency of the lamps 211 and the cooling efficiency of the heat exchanger unit 223 are prevented.

Second Embodiment

While the first embodiment is described by exemplifying the ZAZ film including ZrOx/AlO/ZrOx laminated structure, the above described technique is not limited thereto. The above described technique may be applied to forming a laminated structure of a silicon nitride (SiN) film and a silicon oxide (SiO) film in a 3D-NAND structure.

The second embodiment will be described based on the formation of the laminated structure of a silicon nitride (SiN) film and a silicon oxide (SiO) film.

Substrate Processing Apparatus

Since the substrate processing apparatus used in the second embodiment is the same as the substrate processing apparatus 100 used in the first embodiment, a detailed description of the substrate processing apparatus 100 is omitted. In the second embodiment, a silicon-containing gas, a nitrogen-containing gas and an oxygen-containing gas are used as a first source gas, a first reactive gas and a second reactive gas, respectively. In the second embodiment, the first source gas, the first reactive gas and the second reactive gas are supplied by the gas supply system 260, the gas supply system 270 and the gas supply system 280, respectively.

In the second embodiment, a gas supply unit configured to supply the first source gas is referred to as "first source gas supply unit", a gas supply unit configured to supply the first reactive gas is referred to as "first reactive gas supply unit", and a gas supply unit configured to supply the second reactive gas is referred to as "second reactive gas supply unit".

Substrate Processing

Hereinafter, a substrate processing is described. While the film-forming sequence according to the second embodiments the same as the film-forming sequence according to the first embodiment, detailed configurations of the first layer forming step S1006 and second layer forming step S1010 are different. Therefore, the second embodiment will be described by focusing on the difference from the first embodiment. In the second embodiment, the first element includes silicon.

First Layer Forming Step S1006

In the first layer forming step S1006, a silicon nitride (SiN) film is formed as a first layer. In the first layer forming step S1006, the silicon-containing gas and the nitrogen-containing gas are supplied to the process chamber 201. The silicon-containing gas may include disilane (Si$_2$H$_6$). The nitrogen-containing gas may include ammonia (NH$_3$) gas. As shown in FIG. 10C, the controller 310 controls the components of the substrate processing apparatus 100 such that the wafer 200 is at the substrate processing position PW2, the upper end of the heat exchanger unit 223 is at the position PT3, and the front ends of the lamps 211 are at the position PL1. When ammonia gas is supplied, the plasma generating unit 279 is moved up to convert ammonia gas into plasma.

At this time, the coolant is circulated by opening the valve 230 to supply the coolant to the channel structure 224 and exhausting the coolant which has passed through the channel structure 224. The lamps 211 radiate heat at a predetermined time interval to heat the wafer 200 from the back side thereof. In the first layer forming step S1006, the temperature of the wafer 200 is maintained at the first temperature.

The cooling by the channel structure 224 and the heating by the lamps 211 maintain the wafer 200 at a predetermined temperature. The temperature of the wafer 200 may range from 350° C. to 500° C., preferably 400° C. The temperature in the first layer forming step S1006 is lower than the temperature in the second layer forming step S1010 which is described later. Since the bonding strength of atoms are lower in this temperature range, the silicon nitride (SiN) film which is the first layer formed in the first layer forming step S1006 is more sparse than the silicon oxide (SiO) film which is the second layer.

In the second embodiment, two types of gases are simultaneously or alternately supplied depending on the conditions such as desired film thickness.

When the SiN film having the desired thickness is formed, the first layer forming step S1006 is finished and the state switching step S1008 is performed.

State Switching Step S1008

After the first layer forming step S1006 is finished, the state switching step S1008 is performed. Since the state switching step S1008 of the second embodiment is substantially the same as that of the first embodiment, a detailed description thereof is omitted.

Second Layer Forming Step S1010

The processes below are performed while maintaining the state and the temperature set in the state switching step S1008.

In the second layer forming step S1010, a SiO film, which is the second layer, is formed. In the second layer forming step S1010, a silicon-containing gas and an oxygen-containing gas are alternately supplied into the process chamber 201. The silicon-containing gas may include disilane (Si$_2$H$_6$), and the nitrogen-containing gas may include ammonia (NH$_3$) gas. As shown in FIG. 10E, the controller 310 controls the components of the substrate processing apparatus 10 such that the wafer 200 is at the substrate processing position PW2, the upper end of the heat exchanger unit 223 is at the position PT3, and the front ends of the lamps 211 are at the position PL3. The position PT3 is lower than the position PT2, and the position PL3 is higher than the position PL2. Such configuration results in the heating efficiency in the second layer forming step S1010 being higher than that of the first layer forming step S1006. Therefore, the wafer 200 may be heated to a temperature higher than that of the first layer forming step S1010.

At this time, the coolant is circulated by opening the valve 230 to supply the coolant to the channel structure 224 and exhausting the coolant which has passed through the channel structure 224. The lamps 211 radiate heat at a predetermined time interval to heat the wafer 200 from the back side thereof. As a result, the wafer 200 is maintained at a temperature higher than the first temperature.

The cooling by the channel structure 224 and the heating by the lamps 211 maintain the wafer 200 at a predetermined temperature. The temperature of the wafer 200 may range from 400° C. to 700° C., preferably 500° C. The temperature in the second layer forming step S1010 is higher than the temperature in the first layer forming step S1006. As a result, the SiO film (second layer) denser than the SiN film (first layer) is formed.

In the second embodiment, two types of gases are simultaneously or alternately supplied depending on the conditions such as desired film thickness.

When the SiO film having the desired thickness is formed, the second layer forming step S1010 is finished and the determination step S1012 is performed.

Since the determination step S1012 through the substrate unloading step S1018 of the second embodiment 0162 are the same as those of the first embodiment, detailed descriptions thereof are omitted.

As described above, a laminated structure of a sparse SiN film and a dense SiO film is formed. The SiN film may be etched by a subsequent etching step (not shown) when a 3D-NAND structure is to be formed. The co-existence of the sparse SiN film and the dense SiO film may improve the etch selectivity of the film.

Third Embodiment

Hereinafter, a third embodiment will be described. A substrate processing apparatus 400 according to the third embodiment differs from the substrate processing apparatus 100 according to the first embodiment. The substrate processing apparatus 400 according to the third embodiment will be described with reference to FIG. 12 by focusing on the difference. The elements of the substrate processing apparatus 400 of the third embodiment sharing the same reference numeral with the elements of the substrate processing apparatus 100 of the first embodiment shown in FIG. 1 are the same as those of the substrate processing apparatus 100 of the first embodiment. Therefore, detailed descriptions thereof are omitted.

Substrate Processing Apparatus

The substrate processing apparatus 400 includes a process vessel 202. A plurality of lift pins 401 are provided at the bottom of the process vessel 202.

A substrate support unit 410 supports a wafer 200 and is provided in a process chamber 201. The substrate support unit 410 includes: a substrate support 412 having a placing surface 411 whereon the wafer 200 is placed; a channel structure 224 disposed inside the substrate support 412; and a vacuum insulation structure 413. The vacuum insulating structure 413 is provided between the wafer 200 and the channel structure 224, and is hollow. Through-holes 414 are provided in the substrate support 412 at positions corresponding to the lift pins 401 such that the lift pins 401 penetrate through the through-holes 414.

The substrate support 412 is supported by a shaft 415. The shaft 415 passes through a hole 416 provided at the bottom of the process vessel 202. The shaft 415 is connected to an elevation mechanism 418 outside the process vessel 202 via a support plate 417. The wafer 200 placed on the substrate placing surface 411 is moved up and down by operating the elevation mechanism 418 to move the shaft 415 and the substrate support 412 up and down. A bellows 419 covers the periphery of the lower end of the shaft 415. The interior of the process vessel 202 is maintained airtight.

When the wafer 200 is transferred, the substrate support 412 is moved down until the substrate placing surface 411 faces the substrate loading/unloading port 206, i.e. to the wafer transfer position the position PW1 in FIG. 10A. When the wafer 200 is processed, the substrate support 412 is moved up until the wafer 200 reaches the wafer processing position the position PW2 in FIG. 10C in the process chamber 201.

When the substrate support 412 is lowered to the wafer transfer position, the upper ends of the lift pins 401 protrude from the upper surface of the substrate placing surface 411 to support the wafer 200 from thereunder. When the substrate support 412 is lifted to the wafer processing position, the lift pins 401 are buried from the upper surface of the substrate placing surface 411 and the substrate placing surface 411 support the wafer 200 from thereunder.

A shower head 450, which is a gas dispersion mechanism, is provided on an upstream side of the process chamber 201. A gas introduction hole 241, a gas introduction hole 242, a gas introduction hole 243 and a gas introduction hole 244 are provided on the sidewall of the shower head 450. As in the first embodiment, the gas supply systems shown in FIG. 2 through FIG. 5 are connected to the gas introduction holes, respectively.

The shower head 450 includes a dispersion plate 254. The upstream side of the dispersion plate 254 is referred to as a buffer space 252. The downstream side of the dispersion plate 254 is referred to as the process chamber 201. Through-holes 234a are provided in the dispersion plate 254. The dispersion plate 254 is arranged to face the substrate placing surface 411. The dispersion plate 254 is made of a material which does not block the heat radiated from lamps 211. For example, the dispersion plate 254 is made of quartz.

A lamp housing 460 is provided on the process vessel 202 to face the wafer 200. The lamps 211 are accommodated by the lamp housing 460. The lamps 211 are controlled by a lamp controller 217 as in the first embodiment. A window 461 is provided at the ceiling of the process vessel 202 to face the lamps 211. The window 461 is vacuum-resistant, and does not block the heat radiated from lamps 211. For example, the window 461 is made of quartz.

The channel structure 224 is provided below the back side of the wafer 200. A thermal medium supply pipe 226 and a thermal medium exhaust pipe 227 are connected to the channel structure 224. A thermal medium supply source 228, a flow rate controller 229 and a valve 230 are installed at the thermal medium supply pipe 225 in order from an upstream side to a downstream side of the thermal medium supply pipe 225. The thermal medium exhaust pipe 226 is connected to components such as a reservoir, for example.

The flow rate controller 229 and the valve 230 are electrically connected to a controller 310. The controller 310 is configured to control the flow rate controller 229 and the valve 230 to adjust the conditions such as the flow rate of the thermal medium supplied to the channel structure 224.

A gas supply pipe 420 and a gas exhaust pipe 421 are connected to the vacuum insulation structure 413. An inert gas source 422, a flow rate controller 423 and a valve 424 are installed at the gas supply pipe 420 in order from an upstream side to a downstream side of the gas supply pipe 420. A pump 425 is installed at the gas exhaust pipe 421.

The flow rate controller 423, the valve 424 and the pump 425 are electrically connected to the controller 310. The controller 310 is configured to control the flow rate controller 423, the valve 424 and the pump 425 to adjust a vacuum level of the vacuum insulation structure 413.

The vacuum insulation structure 413 is also referred to as vacuum thermal insulation unit. The vacuum thermal insulation unit may include one of the flow rate controller 423, valve 424, the pump 425 and combinations thereof.

Substrate Processing

Hereinafter, a substrate processing is described. While a film-forming sequence according to the third embodiment is substantially the same as the film-forming sequence according to the first embodiment. Detailed configurations of first layer forming step S1006, the state switching step S1008 and the second layer forming step S1010 are different. Therefore, the third embodiment will be described by focusing on the difference from the first embodiment. In the third embodiment, the formation of ZAZ structure described in the first embodiment will be exemplified.

First Layer Forming Step S1006

In the first layer forming step S1006, a ZrO film is formed as a first layer. In the first layer forming step S1006, TEMAZ gas and ozone gas are alternately supplied into the process chamber 201. The wafer 200 is at the substrate processing position (corresponding to the position PW2 shown in FIG. 10C).

At this time, the coolant is circulated by opening the valve 230 to supply the coolant to the channel structure 224 and exhausting the coolant which has passed through the channel structure 224. The circulated coolant absorbs heat from the wafer 200 and the temperature of the wafer is adjusted to a desired value.

The surface of the wafer 200 is heated by turning on the lamps 211. Specifically, the lamps 211 radiate heat at constant time interval to heat the wafer 200 from the surface thereof. The wafer 200 is heated to a first temperature in the first layer forming step S1006 step.

The cooling by the channel structure 224 and the heating by the lamps 211 maintain the wafer 200 at a predetermined temperature. The temperature of the wafer 200 may range from 300° C. to 400° C., preferably 350° C.

The inside of the vacuum insulation structure 413 is filled with an inert gas at a level which will not degrade the cooling efficiency of the channel structure 224. In the third embodiment, the state of the vacuum insulation structure 413 with little or no thermal insulating effect is referred to as "turning off the vacuum insulation structure 413 off."

State Switching Step S1008

When the first layer forming step S1006 is finished and the state switching step S1008 is performed. In the state switching step S1008 which is performed after the first layer forming step S1006 and before the second layer forming step S1010, the state of the substrate processing apparatus 100 is switched. A detailed description is given below.

After the first layer forming step S1006 is completed, the purge gas is continuously supplied. At this time, the controller 310 controls the operations of the lamps 211 and other components to switch the state of the substrate processing apparatus 100 such that the wafer 200 is at a temperature suitable for the second layer forming step S1010. For example, when the temperature of the wafer 200 suitable for the second layer forming step S1010 is higher than the temperature of the wafer 200 suitable for the first second layer forming step S1006, the controller 310 controls the lamps 211 and other components in a manner that the time interval between the radiations of the lamps 211 is shorter than the time interval between the radiations of the lamps 211 in the first layer forming step S1006, or the amount of heat radiated from the lamps 211 is greater than the amount of heat radiated from the lamps 211 in the first layer forming step S1006. Simultaneously, the pump 425 is operated to exhausts the vacuum insulation structure 413 until the inner pressure of the vacuum insulation structure 413 reaches a vacuum level. In the third embodiment, the state of the vacuum insulation structure 413 with high thermal insulating effect is referred to as "turning on the vacuum insulation structure 413 off."

When the vacuum insulation structure 413 is turned on, the effect of the coolant supplied into the channel structure 224 is blocked by the vacuum insulation structure 413. As a result, the wafer 200 is not affected by the cooling by the channel structure 224. At this time, the controller 310 is configured to maintain the heating by the lamps 211. Therefore, the heating efficiency is improved.

Second Layer Forming Step S1010

Hereinafter, the second layer forming step S1010 is described. An example wherein the temperature of the wafer 200 suitable for the second layer forming step S1010 is higher than the temperature of the wafer 200 suitable for the first layer forming step S1006 is described. In the second layer forming step S1010, an AlO film (second layer) is formed by alternately supplying AlCl3 gas and ozone gas into the process chamber 201.

The wafer 200 is heated by the lamps 211 maintained at a predetermined temperature while maintaining the state and the temperature set in the state switching step S1008. The temperature of the wafer 200 may range from 400° C. to 500° C., preferably 450° C. In the second layer forming step S1010, the wafer 200 is maintained at a second temperature.

When the AlO film having a desired thickness is formed, the determination step S1012 is performed.

Since the determination step S1012 through the substrate unloading step S1018 of the third embodiment are the same as those of the first embodiment, detailed descriptions thereof are omitted.

The substrate processing apparatus and the substrate processing method are advantageous in that the in-situ formation of the laminated film including the layers formed at different conditions may be facilitated, resulting in improved productivity of semiconductor devices.

According to the technique described herein, the productivity of manufacturing of a semiconductor device is improved even in a method of processing a film by repeating different processes.

What is claimed is:

1. A method of manufacturing a semiconductor device, comprising:
    (a) loading a substrate into a process vessel;
    (b) forming a first layer by supplying a first gas into the process vessel by a gas supply unit while maintaining the substrate at a first temperature by a temperature control unit; and
    (c) forming a second layer different from the first layer by supplying a second gas different from the first gas into the process vessel by the gas supply unit while maintaining the substrate at a second temperature different from the first temperature by the temperature control unit, wherein
    the temperature control unit comprises: a heat exchanger unit facing a back side of the substrate and configured to adjust a temperature of the substrate; an elevation unit configured to adjust a distance between the heat exchanger unit and the substrate; and a lamp configured to heat the substrate from the back side thereof, and a distance between the heat exchanger unit and the substrate in (b) is different from a distance between the heat exchanger unit and the substrate in (c).

2. The method of claim 1, wherein the first gas comprises a first source gas containing a first element supplied by a first source gas supply unit included in the gas supply unit, a reactive gas reactive with the first source gas is further supplied by a reactive gas supply unit included in the gas supply unit in (b), and the second gas comprises a second source gas containing a second element different from the first element supplied by a second source gas supply unit included in the gas supply unit, and the reactive gas reactive with the second source gas is further supplied by the reactive gas supply unit in (c), and wherein the temperature control unit is configured to maintain the temperature of the substrate at the first temperature in (b) and the second temperature in (c).

3. The method of claim 2, wherein an amount of heat radiated from the lamp in (b) is different from an amount of heat radiated from the lamp in (c).

* * * * *